(12) United States Patent
Giusti et al.

(10) Patent No.: US 10,770,643 B2
(45) Date of Patent: Sep. 8, 2020

(54) PIEZOELECTRIC MICRO-ELECTRO-MECHANICAL ACTUATOR DEVICE, MOVABLE IN THE PLANE

(71) Applicant: STMICROELECTRONICS S.R.L., Agrate Brianza (IT)

(72) Inventors: Domenico Giusti, Monza (IT); Anna Alessandri, Vimercate (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 605 days.

(21) Appl. No.: 15/638,195

(22) Filed: Jun. 29, 2017

(65) Prior Publication Data
US 2018/0190895 A1    Jul. 5, 2018

(30) Foreign Application Priority Data
Dec. 29, 2016    (IT) ........................ 102016000132144

(51) Int. Cl.
| | | |
|---|---|---|
| H01L 41/09 | (2006.01) | |
| H02N 2/04 | (2006.01) | |
| B81B 3/00 | (2006.01) | |
| G02B 26/08 | (2006.01) | |
| H01G 5/18 | (2006.01) | |
| H01G 5/38 | (2006.01) | |
| H01H 57/00 | (2006.01) | |

(52) U.S. Cl.
CPC ........ *H01L 41/0953* (2013.01); *B81B 3/0018* (2013.01); *G02B 26/0833* (2013.01); *H01G 5/18* (2013.01); *H01G 5/38* (2013.01); *H01L 41/094* (2013.01); *H01L 41/0946* (2013.01); *H02N 2/043* (2013.01); *H02N 2/046* (2013.01); *H01H 2057/006* (2013.01)

(58) Field of Classification Search
CPC ............... H01L 41/0953; H01L 41/094; H01L 41/0946; B81B 3/0018; G02B 26/0833; H01G 5/18; G01G 5/38; H02N 2/043; H02N 2/046; H01H 2057/006
USPC .................................................. 310/348–353
See application file for complete search history.

(56) References Cited

U.S. PATENT DOCUMENTS

| | | |
|---|---|---|
| 5,046,773 A | 9/1991 | Modesitt |
| 8,979,149 B2 | 3/2015 | Sun et al. |
| (Continued) | | |

FOREIGN PATENT DOCUMENTS

| | | |
|---|---|---|
| CN | 1047647347 A | 5/2015 |
| CN | 105058366 A | 11/2015 |
| (Continued) | | |

*Primary Examiner* — Thomas M Dougherty
(74) *Attorney, Agent, or Firm* — Seed Intellectual Property Law Group LLP

(57) ABSTRACT

A MEMS actuator device of a piezoelectric type formed on a substrate, with a base unit including a base beam element having a main extension in a extension plane and a thickness in a thickness direction perpendicular to the extension plane, smaller than the main extension. A piezoelectric region extends over the beam element. An anchor region is rigid to the base beam element and to the substrate. A base constraint structure is connected to one end of the base beam element and is configured to allow a deformation of the base beam element in the extension plane and substantially reduce a deformation of the base beam element in the thickness direction.

23 Claims, 7 Drawing Sheets

(56) References Cited

U.S. PATENT DOCUMENTS

| | | |
|---|---|---|
| 2005/0146248 A1 | 7/2005 | Moler et al. |
| 2007/0024715 A1 | 2/2007 | Hirasawa et al. |
| 2014/0265731 A1 | 9/2014 | Storm et al. |
| 2015/0198801 A1* | 7/2015 | Naono ................ H01L 41/0953 359/199.4 |
| 2016/0195893 A1* | 7/2016 | Hilt ...................... B81B 3/0051 310/311 |
| 2017/0155038 A1* | 6/2017 | Caraveo ................ H01L 41/094 |
| 2018/0190895 A1 | 7/2018 | Giusti et al. |
| 2019/0240844 A1 | 8/2019 | Giusti et al. |

FOREIGN PATENT DOCUMENTS

| | | |
|---|---|---|
| DE | 19523229 A1 | 1/1997 |
| DE | 10107402 A1 | 8/2002 |
| EP | 0441060 A2 | 8/1991 |
| JP | H0890478 A | 4/1996 |
| WO | 2010/094102 A1 | 8/2010 |

\* cited by examiner

PIEZOELECTRIC MICRO-ELECTRO-MECHANICAL ACTUATOR DEVICE, MOVABLE IN THE PLANE

BACKGROUND

Technical Field

The present disclosure relates to a piezoelectric micro-electro-mechanical actuator device.

Description of the Related Art

As is known, actuators are devices that convert a physical variable of one type into a physical variable of a different type, and the variable deriving from the conversion usually involves some form of movement or mechanical action.

Recently, there have been proposed actuators of micrometric and nanometric dimensions, also referred to as micro-actuators or nano-actuators, which may be obtained with so-called MEMS (Micro-Electro-Mechanical Systems) semiconductor technology and may thus be produced at very contained costs. They may be used in a variety of devices, in particular in mobile and portable devices.

Examples of micro-actuators are valves, switches, pumps, linear and rotary micromotors, and linear positioning devices.

Known micro-actuators basically work according to four physical principles:

electrostatic principle: they exploit the attraction between conductors charged in an opposite way;
thermal principle: they exploit the displacement caused by thermal expansion or contraction;
piezoelectric principle: they exploit the displacement caused by the strain and stress induced by electrical fields; and
magnetic principle: they exploit the displacement caused by the interaction between different elements having magnetic characteristics, such as permanent magnets, external magnetic fields, magnetizable materials, and conductors of electric current.

Each technology has advantages and limits as regards to power consumption, rapidity of movement, force exerted, amplitude of movement, profile of movement, ease of manufacture, amplitude of the applied electrical signals, robustness, and sensitivity, which cause them to be advantageous in certain applications but not in others and thus determine the field of use.

Hereinafter, an MEMS actuator device is considered that operates according to a piezoelectric principle and in particular is able to exploit TFP (Thin-Film-Piezo) MEMS technology.

TFP MEMS technology currently uses a unimorph actuation mode, in which a structure (membrane, beam, or cantilever), generally comprising at least two layers arranged on top of each other, is bent as a result of variations in the induced strain. In this case, there is a controlled alteration of the strain in one of the layers, referred to as "active layer", which causes a "passive" strain in the other layer or layers, also referred to as "inactive or passive layers", with consequent bending of the structure.

The above technique is advantageously used for bending the membrane or beam or cantilever in applications where a vertical movement is desired, i.e., a movement in a direction perpendicular to the plane of lie of the structure, such as in liquid-jet printing heads, autofocus systems, micro-pumps, microswitches, etc.

For instance, in FIGS. 1A and 1B, a cantilever beam 1 is illustrated, constrained at a first end 2 and free to bend at a second end 3. The beam 1 is here formed by a stack of layers including a supporting layer 5, for example of a semiconductor material of a first conductivity type, here a P type, an active layer 6, for example, of intrinsic (non-doped) semiconductor material, forming a piezoelectric layer, and a top layer 7, for example of a semiconductor material of a second conductivity type, here an N type.

In case of reverse biasing, as illustrated in FIG. 1B, the applied electrical field causes strains in the beam 1 that causes the free end 3 to bend downwards.

An embodiment of a piezoelectric MEMS actuator applied to an optical device is illustrated in FIGS. 2A and 2B. In these figures, the optical device, designated by 10, comprises a membrane 15, of glass, resting, through a lens element 11 of polymeric material, on a support 12, also of glass, and carrying two piezoelectric regions 13, arranged at a distance from each other. With no biasing, the membrane 15 and the lens element 11 have a planar surface and do not modify the path of a light beam 16 that traverses them. When the piezoelectric regions 13 are biased, they cause a deformation of the membrane 15. The deformation of the central area of the membrane 15 is transmitted to the lens element 11, the top surface whereof curves, modifying the focus of the lens element 11 and thus the path of the light beam 16. It is thus possible to modify the optical transmission characteristics of the device 10.

In the examples illustrated in FIGS. 1A, 1B, 2A, and 2B, the strain generated by biasing a piezoelectric layer causes a deformation in a vertical direction, perpendicular to the extension plane of the piezoelectric layer.

Up to now, it has not been possible to generate movements "in the plane" of the beam or membrane (i.e., in a direction parallel to the two main extension directions) using the piezoelectric principle.

BRIEF SUMMARY

One or more embodiments are directed to a MEMS actuator operating according to the piezoelectric principle and acting in the plane.

In one embodiment the MEMS actuator comprises a beam carrying a piezoelectric region and having a first end constrained to a substrate and a second end connected to a Z-constraint structure. The Z-constraint structure prevents or substantially reduces deflection of the second end of the beam in a vertical direction, but allows the second end to displace in the plane when the beam undergoes deformation by the piezoelectric effect. In particular, the Z-constraint structure causes the displacement in a vertical direction to be less than 5% with respect to the displacement in the plane. A lever structure fixed with respect to the second end of the beam and pivoted at the Z-constraint structure amplifies the in-plane movement of the latter. The in-plane movement may be further amplified by similar piezoelectric units, generating an in-plane movement of the actuator with a desired amplitude.

BRIEF DESCRIPTION OF THE SEVERAL VIEWS OF THE DRAWINGS

For a better understanding of the present disclosure preferred embodiments thereof are now described, purely by way of non-limiting example, with reference to the attached drawings, wherein.

DETAILED DESCRIPTION

Figure 1A:
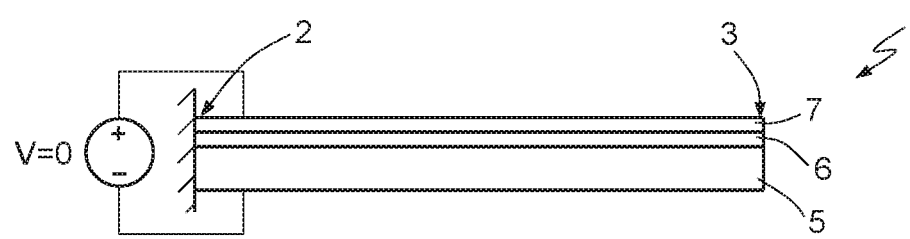
FIGS. 1A and 1B are simplified side views of a MEMS actuator of a piezoelectric type in a rest condition and in a deformed condition, respectively.
Figure 1B:
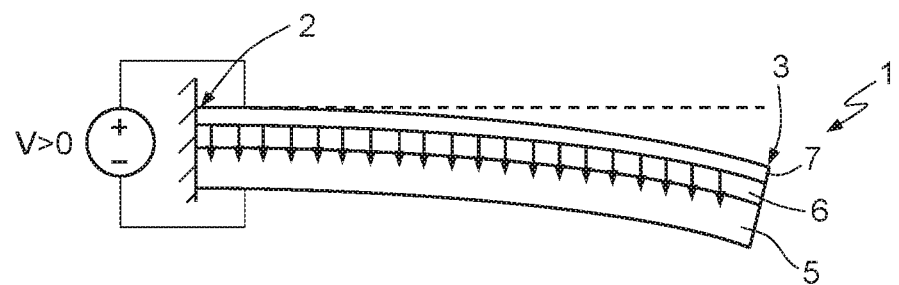
Figure 2A:
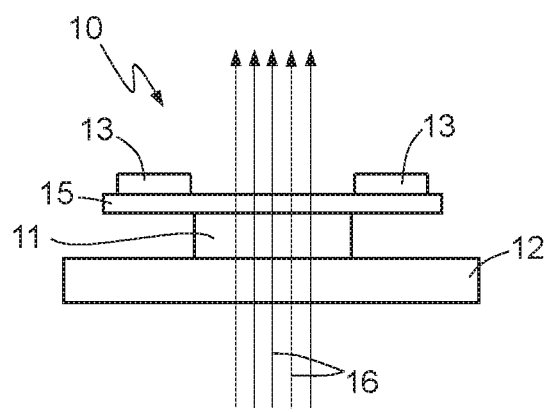
FIGS. 2A and 2B are simplified side views of another MEMS actuator of a piezoelectric type, used in an optical device.
Figure 2B:
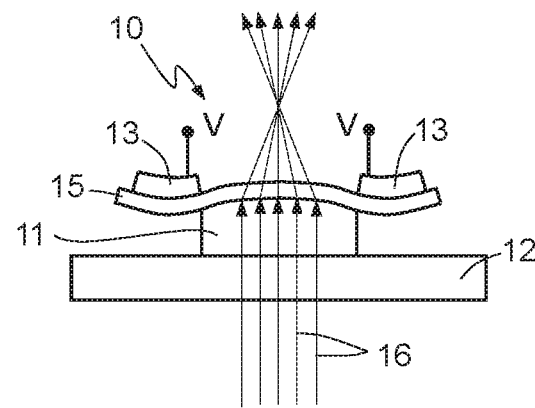
Figure 3:
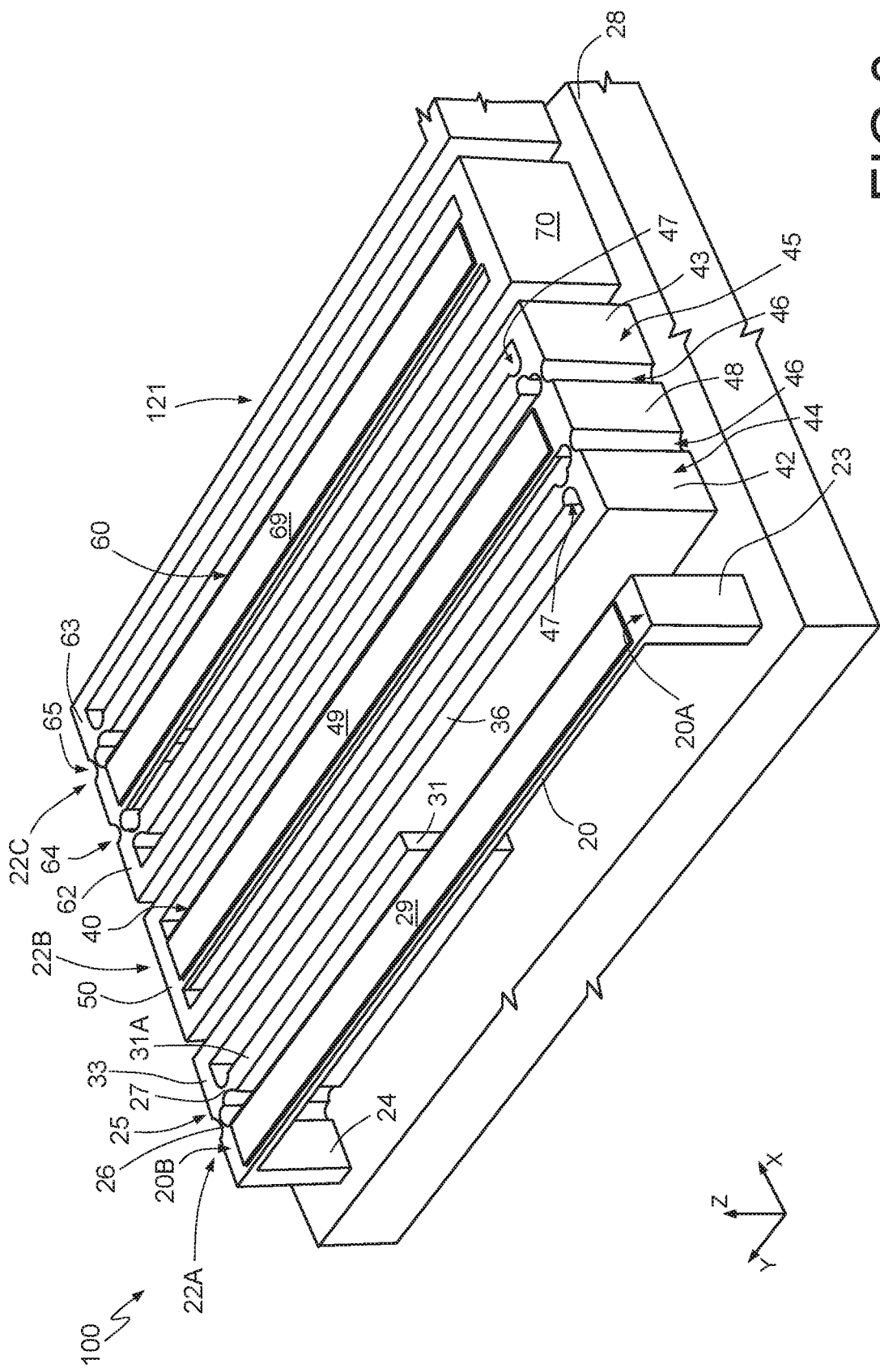
FIG. 3 is a simplified perspective view of an embodiment of the present actuator.
Figure 4:
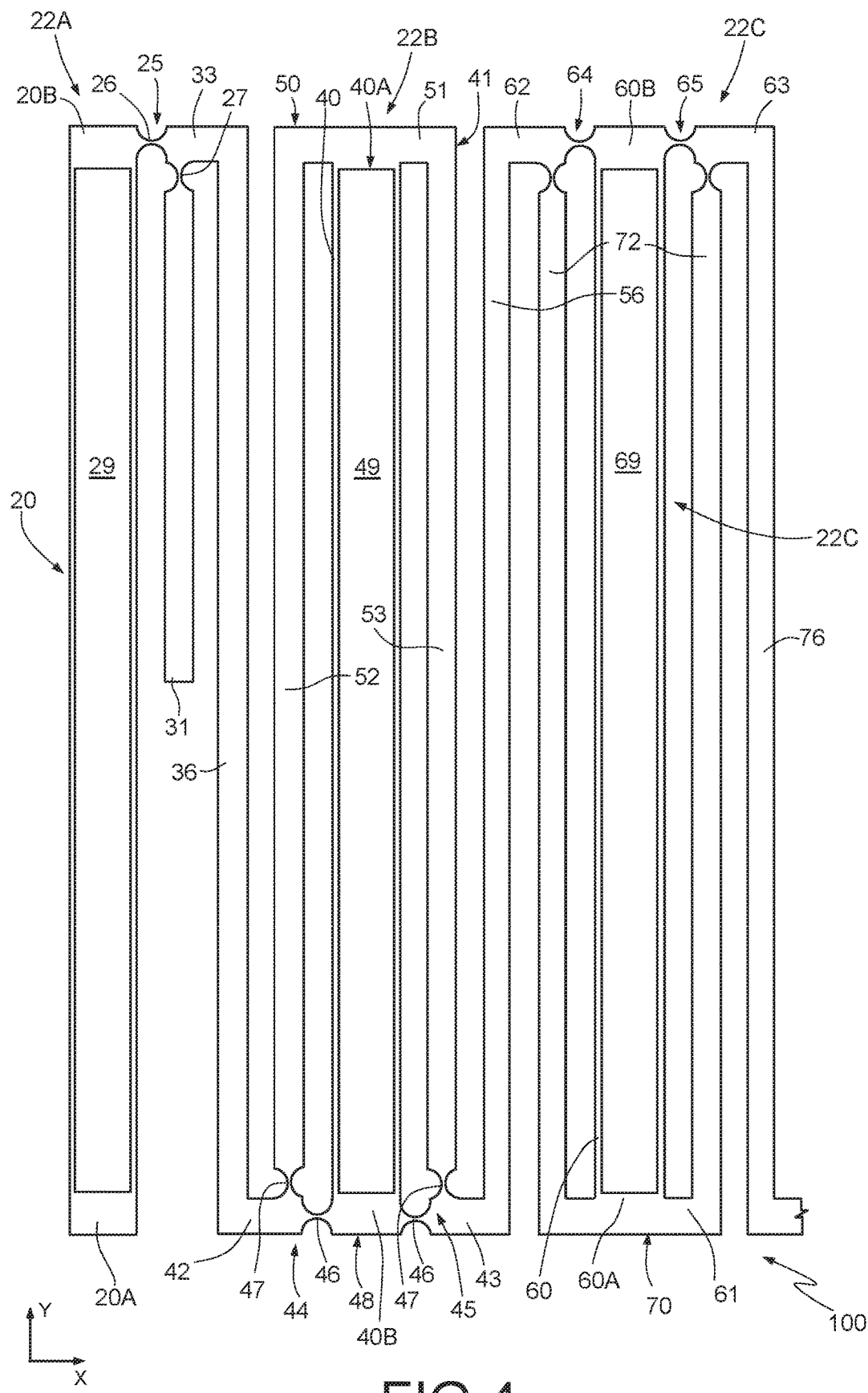
FIG. 4 is a top plan view of the actuator of FIG. 3.

FIGS. 3 and 4 show an embodiment of an actuator 100 made using the MEMS technology, operating according to a piezoelectric principle and mobile in the plane.

The actuator 100 comprises a monolithic region 121 of semiconductor material, for example monocrystalline silicon or polycrystalline silicon, obtained, for example, by epitaxial growth on a sacrificial layer and defined via usual photolithographic masking and chemical etching steps so as to form a plurality of units 22 (22A, 22B, 22C, etc), which are connected in series to each other and are monolithic with respect to each other.

In the example illustrated, the units 22 comprise a base unit 22A, a first lateral unit 22B and a second lateral unit 22C, arranged on one side of the base unit 22A and connected to the latter, in series, as explained hereinafter. Possible other lateral units (not shown) may be connected in series to the second lateral unit 22C, if so desired. Furthermore, other lateral units may be provided on the opposite side of the base unit 22A, in this case the base unit 22A having longitudinal symmetry.

In the rest condition, in the embodiment illustrated, i.e., in the absence of biasing, the units 22 are formed by elongated elements that extend parallel or transverse to each other (for example, perpendicular to each other). Even though, when actuated, some elements of the units 22 undergo deformation, rotate, or translate with respect to the rest position, as described hereinafter with reference to FIGS. 7-10, the following description refers to the rest condition illustrated in FIGS. 3 and 4.

The base unit 22A is substantially formed by a base beam 20, by a first pillar 23 and a second pillar 24, by a constrained arm 31 and by a base hinge structure 25, the constrained arm 31 and the base hinge structure 25 forming a base constraint structure 21. The base unit 22A further comprises a base lever arm 33, pivoted on the base constraint structure 21.

The base beam 20 has a main extension (length) parallel to an axis Y of a Cartesian reference system XYZ, and has a first end 20A and a second end 20B. The first end 20A of the base beam 20 is constrained to a substrate 28, for example of monocrystalline silicon, by the first pillar 23, which extends transversely to the base beam 20, parallel to the axis Z of the Cartesian reference system XYZ. In the illustrated embodiment, the first pillar 23 extends between the first end 20A of the base beam 20 and the substrate 28, and is rigid with them. The second pillar 24 extends from the second end 20B of the base beam 20 to the substrate 28, also extends parallel to the axis Z, without being constrained to the substrate 28. Typically, the second pillar 24 has a height (in direction Z) that is slightly lower than the first pillar 23; for example, it is formed on a sacrificial portion of smaller depth, removed when releasing the monolithic region 121, as explained hereinafter. Alternatively, the first and second pillars 23, 24 could have the same thickness, and the substrate could be removed underneath the second pillar 24. For instance, the base beam 20 may have a thickness (in direction Z) of 3-20 µm, a length (in direction Y) of approximately 200-1000 µm, and a width (in direction X) of 40-100 µm, the first pillar 23 could have a height of approximately 50-400 µm, and the second pillar 24 could have a height of approximately 40-350 µm.

A first piezoelectric strip 29, for example of PZT (Pb, Zr, $TiO_3$), with a thickness of approximately 0.2-3 µm, extends over the base beam 20. The first piezoelectric strip 29 may have an extension (width and/or length) slightly smaller than the area of the base beam 20.

In the illustrated embodiment, the constrained arm 31 is formed by a vertical wall extending parallel to the base beam 20 and has a constrained end 31A close to the second end 20B of the base beam 20, to which it is connected through the base hinge structure 25. The constrained arm 31 is here anchored to the substrate 28 throughout its length (in direction Y), which is approximately one half that of the base beam 20, and has the same height as the first pillar 23. Furthermore, in the illustrated embodiment, the constrained arm 31 has a smaller width than the base beam 20, for example 10-50 µm (in general, its width depends upon the desired stiffness of the structure).

The base hinge structure 25 comprises a first hinge portion 26 and a second hinge portion 27, formed by smaller thickness portions, connecting the base beam 20 to the constrained arm 31 and to the base lever arm 33. In detail, the first hinge portion 26 of the base hinge structure 25 extends between the second end 20B of the base beam 20 and the base lever arm 33, of which it represents an ideal prolongation, of smaller width (in direction Y). For instance, in its point of minimum width, the first hinge portion 26 may have a width of 10-50 µm (in general, its width depends upon the desired stiffness of the structure). The second hinge portion 27 of the base hinge structure 25 extends between the base lever arm 33 and the constrained arm 31, of which it represents an ideal prolongation, of a smaller width (in direction X).

The base lever arm 33 has a main extension perpendicular to the base beam 20, and thus parallel to axis X, and is formed by a wall having a height (parallel to axis Z) equal the second pillar 24.

Both hinge portions 26, 27 have a height (in direction Z) that is the same as the second pillar 24 and the base lever arm 33.

Figure 5:
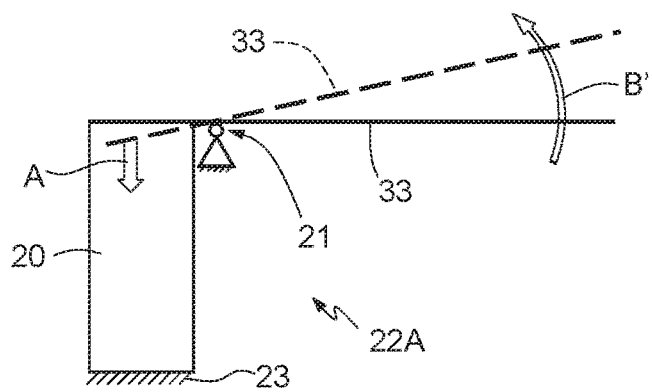
FIG. 5 is an equivalent mechanical diagram of the actuator of FIG. 3.

In this way, as better described hereinbelow, the constrained arm 31, the base lever arm 33, and the base hinge structure 25, which are substantially rigid along Z due to their thickness, prevent (to a first approximation) the second end 20B of the base beam 20 from bending vertically. Instead, the base hinge structure 25 allows the second end 20B of the base beam 20 to move in the plane XY and forms a fulcrum for the base lever arm 33, which may thus rotate in plane XY. Since the base lever arm 33 is articulated in proximity of an end thereof (connected to the second end 20B of the base beam 20) and has its longer portion between the base hinge structure 25 (fulcrum) and the other end, it amplifies the movement of displacement/rotation of the second end 20B of the base beam 20, as illustrated in FIG. 5.

The base unit 22A is connected to the first lateral unit 22B through a first connection arm 36. The first connection arm 36 extends parallel to the base beam 20 and to the constrained arm 31, has a length (in direction Y) equal the base beam 20, a height (in direction Z) equal to the second pillar 24, and a width (in direction X) of 100-500 μm. Furthermore, it has a first end rigidly connected to the base lever arm 33 and a second end rigidly connected to the first lateral unit 22B.

The first lateral unit 22B in turn comprises a first lateral beam 40 and a first lateral constraint structure 41 as best shown in FIG. 4. The first lateral unit 22B further comprises a first lateral lever arm 42 and a second lateral lever arm 43. The first lateral unit 22B has a longitudinally symmetrical structure, wherein each half is similar to the base unit 22A, but turned over through 180°. The elements of the first lateral unit 22B similar to those of the base unit 22A are thus identified by the same reference numbers increased by 20.

The first lateral beam 40 is here altogether similar to the base beam 20 and has in particular the same length, the same width, and the same thickness. It extends parallel to the base beam 20 and carries a second piezoelectric strip 49, here identical to the first piezoelectric strip 29, and thus of the same material and having the same geometrical characteristics. The first lateral beam 40 has a first end 40A rigidly connected to the first lateral constraint structure 41 and a second end articulated to the first lateral constraint structure 41 and to the first and second lateral lever arms 42, 43. A lateral pillar portion 48 extends from the second end 40B of the first lateral beam 40 to the substrate 28, in a direction parallel to the axis Z, without being constrained to the substrate 28 itself, like the second pillar 24. The lateral pillar portion 48 here has a height (in the direction Z) substantially equal to that of the second pillar 24.

The first lateral constraint structure 41 comprises a U-shaped element 50, a first lateral hinge structure 44, and a second lateral hinge structure 45. The U-shaped element 50 in turn comprises a base side 51 extending perpendicular to the first lateral beam 40, and two lateral constrained arms 52, 53, each extending on a respective side of the first lateral beam 40, parallel to the latter and at the same distance therefrom. The base side 51 is fixed with respect to the first end 40A of the first lateral beam 40 and is arranged so that the first lateral beam 40 extends exactly at the center of and longitudinally with respect to the first lateral constraint structure 41, with the lateral constrained arms 52, 53 arranged (at rest) symmetrically on the two longitudinal sides of the first lateral beam 40. The lateral constrained arms 52, 53 of the first lateral constraint structure 41 have a length (in direction Y) approximately equal to the first lateral beam 40 and are connected (at their ends remote from the base side 51) to the second end 40B of the first lateral beam 40 through the first and second lateral hinge structures 44, 45.

The base side 51 and the two lateral constrained arms 52, 53 of the first lateral constraint structure 41 have a width approximately equal to the first connection arm 36 and have a depth (in direction Z) equal to the first connection arm 36, as may be noted in particular in FIG. 3 for the lateral constrained arm 52. The first lateral constraint structure 41 is thus substantially rigid (undeformable) in direction Z.

The first and second lateral hinge structures 44, 45 are similar to the base hinge structure 25 and are each formed by a respective first lateral hinge portion 46 and second lateral hinge portion 47, formed by smaller width regions. In detail, the first lateral hinge portion 46 of the first lateral hinge structure 44 extends as a prolongation of the first lateral lever arm 42, between the latter and the second end 40B of the first lateral beam 40 (and is thus contiguous to the lateral pillar portion 48). The second lateral hinge portion 47 of the first lateral hinge structure 44 extends as a prolongation of the first lateral constrained arm 52, between the latter and the second lateral lever arm 42. The first lateral hinge portion 46 of the second lateral hinge structure 45 extends as a prolongation of the second lateral lever arm 43, between the latter and the second end 40B of the first lateral beam 40 (and is thus contiguous to the lateral pillar portion 48). The second lateral hinge portion 47 of the second lateral hinge structure 45 extends as a prolongation of the second lateral constrained arm 53, between the latter and the second lateral lever arm 43.

Thereby, the first lateral constraint structure 41 prevents, to a first approximation, vertical displacement (in direction Z) of the second end 40B of the first lateral beam 40; shrinking and deformation of the latter, when biased, cause in-plane rotation of the lateral articulated arms 42, 43, about a substantially vertical axis, as explained hereinafter with reference to FIGS. 7-10.

The second lateral lever arm 43 is connected to the second lateral unit 22C through a second connection arm 56, altogether similar to the first connection arm 36. It thus extends (at rest) parallel to the base beam 20, has a length equal to the latter, and a height equal to the second pillar 24. The second connection arm 56 further has a first end rigidly connected to the second lateral lever arm 43 and a second end rigidly connected to the second lateral unit 22C.

The second lateral unit 22C is altogether identical to the first lateral unit 22B, but it is turned over through 180°. Thus, its elements are identified by the same reference numbers increased by 20.

In particular, the second lateral unit 22C comprises a second lateral beam 60, a second lateral constraint structure 61, a third lateral lever arm 62 and a fourth lateral lever arm 63. In turn, the second lateral constraint structure 61 comprises a U-shaped element 70 (including lateral constrained arms 72, 73), a third lateral hinge structure 64, and a fourth lateral hinge structure 65, which have the same mutual arrangement and the same geometrical characteristics as those already described for the corresponding components 40-43, 52, 53 of the first lateral unit 22B. Furthermore, the second lateral beam 60 carries a third piezoelectric strip 69, here altogether identical to the first and second piezoelectric strips 29, 49.

The second lateral lever arm 63 of the second lateral unit 22C is connected to a third connection arm 76, identical to the first and second connection arms 36, 56. It may be connected to other lateral units (not illustrated) to further amplify the actuation movement or simply to form an actuation end, which may be connected to a driven member (not illustrated), as explained hereinafter.

Thereby, since the second lateral unit 22C is turned over with respect to the first lateral unit 22B, the second end 40B of the first lateral beam 40 and the first end 60A of the second lateral beam 60 are aligned to the first end 20A of the base beam 20, and the first end 40A of the first lateral beam 40 and the second end 60B of the second lateral beam 60 are aligned to the second end of the base beam 20.

Figure 6:
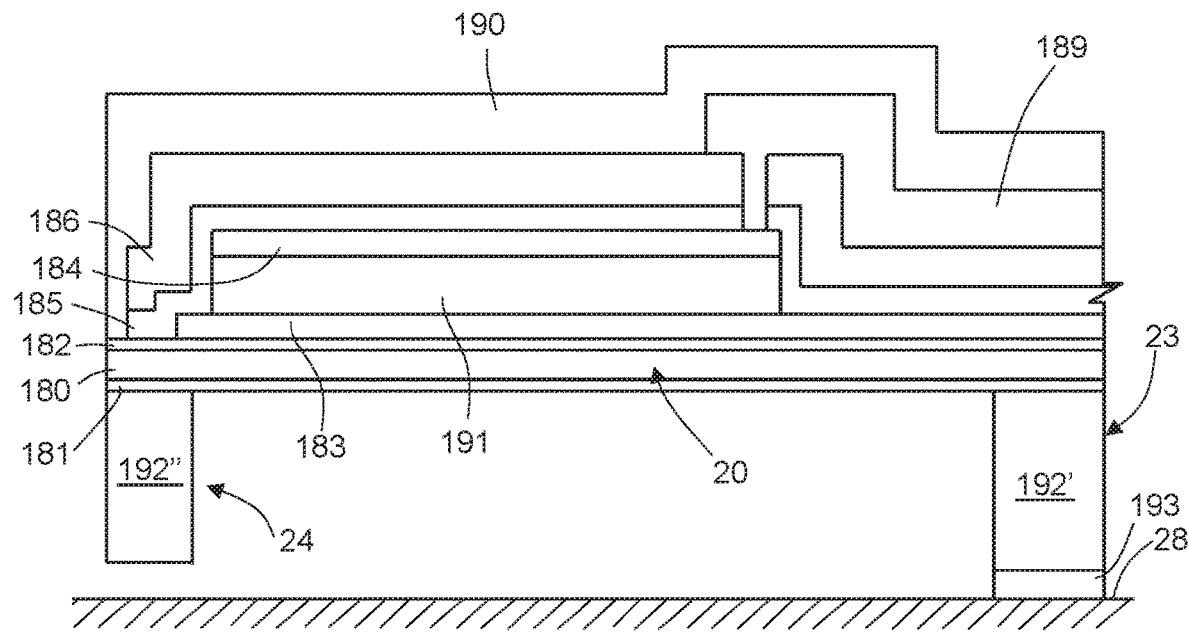
FIG. 6 is a cross-section of a portion of the actuator of FIGS. 3 and 4, at an enlarged scale.

An embodiment of the structure of the base beam 20 and of the piezoelectric strip 29 is shown in the section taken along a vertical plane in FIG. 6.

In detail, the beam 20 is formed by a supporting layer 180 of epitaxially grown silicon, covered at the bottom by a bottom insulating layer 181 and at the top by a top insulating layer 182, for example, both of thermally grown silicon oxide. A stack on the top insulating layer 182 is formed by a bottom electrode 183, of electrically conductive material, for example titanium (Ti) or platinum (Pt); a piezoelectric material 191; a top electrode 184, for example of TiW; a first dielectric layer 185 and a second dielectric layer 186, for example of CVD (Chemical Vapor Deposition) deposited silicon oxide and silicon nitride; a contact line 189 of conductive material, for example aluminum and/or copper; and a passivation layer 190, for example silicon oxide and/or CVD deposited nitride.

FIG. 6 also shows the structure of the first pillar 23, which, in the illustrated embodiment, comprises a first silicon portion 192' and a second silicon portion 193 bonded together, and the structure of the second pillar 24, formed by a single silicon portion 192", formed simultaneously with and with the same thickness as the first silicon portion 192' of the first pillar 23, for example as explained hereinafter.

It should be noted that the first pillar 23 may have a broad area, with portions not illustrated, for forming pads and possible other structures for the electrical connections with the electrodes 183, 184, as to for a person skilled in the art.

The structure of the lateral beams 40, 60 is similar to base beam 20, but differs in that, instead of the pillar 23, lateral beams 40, 60 have lateral pillar portion 48 or the base side 51, made like the second pillar 24.

As mentioned above, the actuator 100 may be formed by bonding two wafers, prepared separately and bonded together according to the manufacturing method described hereinafter.

For instance, a first wafer comprising the substrate 28 is processed by growing a sacrificial layer, for example of thermal oxide having a thickness of 2-10 µm, on the substrate 28; first masking and etching to define through openings in the sacrificial layer where the first pillars 23 and the constrained arms 31 are to be grown; epitaxial growing polysilicon with a thickness of, for example, 5-20 µm; and lapping and removing the epitaxial polysilicon until reaching the sacrificial layer so as to leave only the polysilicon portions in the through openings defined previously, thus forming the second portion 193 of the first pillars 23 (and of the constrained arms 31).

Simultaneously, before, or after, a second wafer is processed; the second wafer being for example a SOI (Silicon-On-Insulator) type with a thickness of 400-720 µm, in which the intermediate oxide layer has a thickness of 0.5-1 µm and is intended to form the bottom insulating layer 181 of FIG. 6, one of the two silicon layers (for example, the top one) forms the supporting layer 180 of FIG. 6, and the other silicon layer (in the example, the bottom one) forms the portions 192' and 192" of FIG. 6. Here, the intermediate oxide layer (bottom insulating layer 181) has a stress-balancing function and operates also as a hard stop while etching the bottom silicon layer for forming portions 192', 192", as explained hereinafter.

For instance, the second wafer is processed by thermally growing the top insulating layer 182 on the top silicon layer (supporting layer 180); depositing and patterning the layers intended to form the piezoelectric regions and the corresponding biasing and electrical-connection structures, as well as the dielectric layers (regions 183, 184, 185, 186, 190 and 191 of FIG. 6), in a per se known manner; lapping the back of the second wafer until reaching the desired thickness for the pillars 24, 48, the lever arms 33, 42, 43 and the hinge structures 25, 44, 45, 64, 65 in the bottom silicon layer; masking and back-etching the bottom silicon layer to define the structure of the beams 20, 40, and 60, until reaching the bottom insulating layer 181 of FIG. 6 (in practice, openings are provided having a shape in plan view corresponding to that of the beams 20, 40, 60).

Then, the two wafers are bonded by aligning the portions 193 of the first wafer with the corresponding portions (not yet defined) in the bottom silicon layer of the second wafer. Then the geometry of FIG. 4 is defined and the top silicon layer is etched as far as the bottom insulating layer 181; the bottom insulating layer 181 and then the sacrificial oxide layer of the first wafer are removed to release the entire monolithic structure 121 except for the pillars 23 and the constrained arms 31 that remain fixed to the substrate 28.

Operation of the actuator 100 will now be illustrated with reference to FIGS. 5 and 7 to 10.

Figure 7:
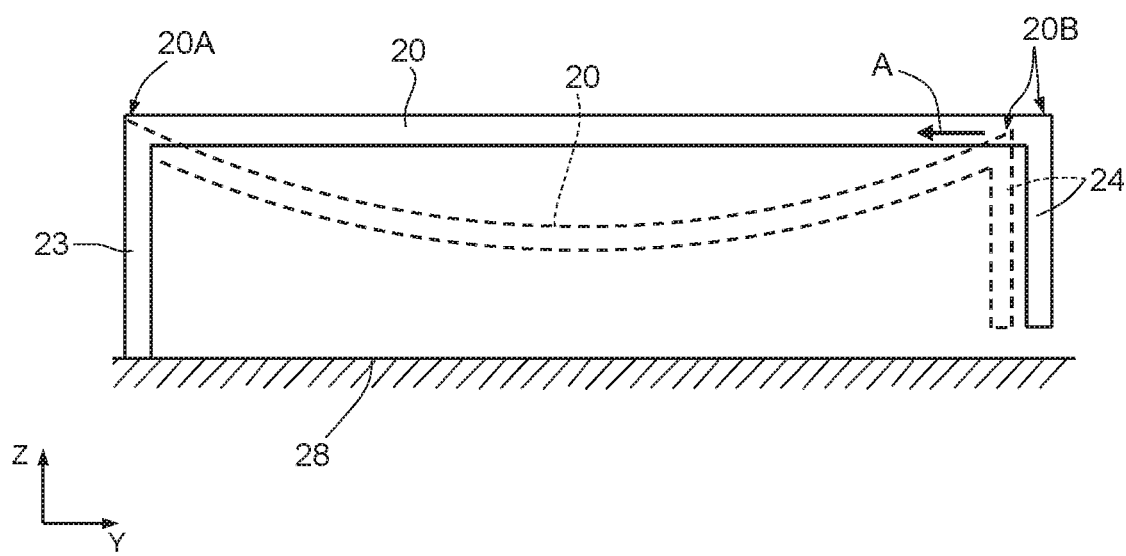
FIG. 7 is a simplified side view of a part of the actuator of FIGS. 3 and 4 in a rest condition (represented with a solid line) and in the deformed condition (represented with a dashed line)
Figure 8:
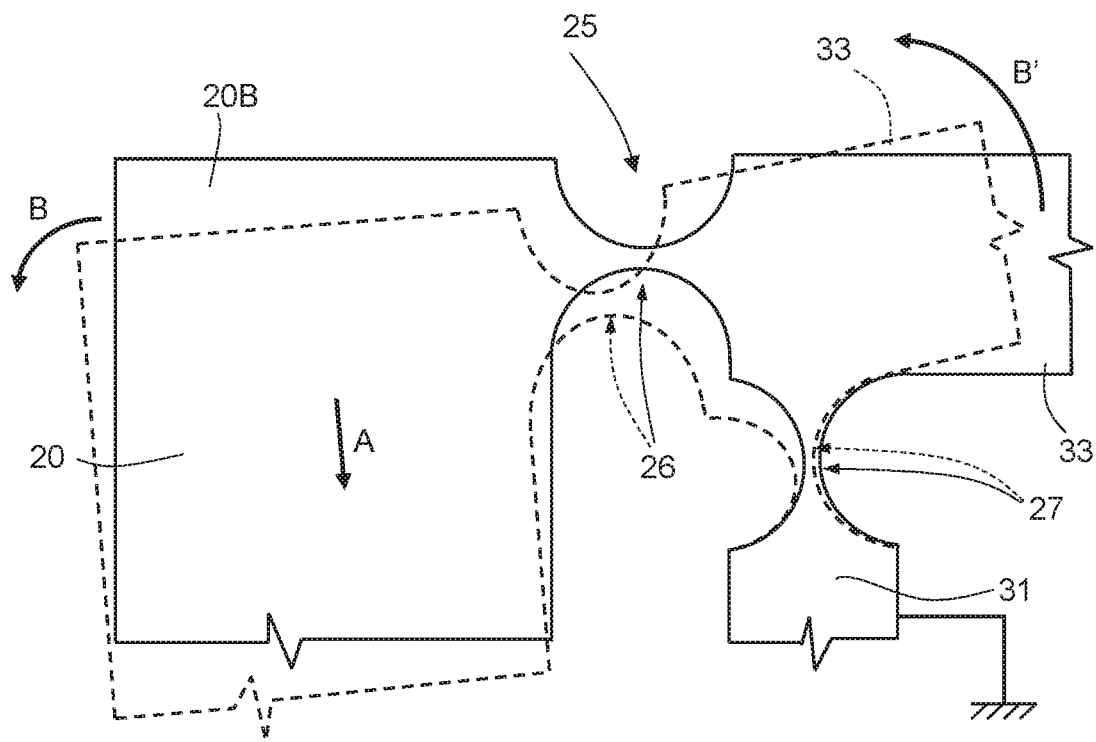
FIG. 8 is a top plan view and at an enlarged scale of a detail of the actuator of FIGS. 3 and 4, in a rest condition (represented with a solid line) and in the deformed condition (represented with a dashed line)

As previously mentioned, when the piezoelectric material strips 29, 49, 69 are not biased, the actuator 100 is in its rest configuration, illustrated in FIGS. 3-5 and in FIGS. 7 and 8 with a solid line. When the piezoelectric material strips 29, 49, 69 are biased through the electrodes 183, 184 of FIG. 6, for example by applying a voltage of 30-40 V to the top electrode 184 and grounding the bottom electrode 183, they shrink, causing a deformation of the respective beams 20, 40, 60. FIG. 7 shows in side view, with a dashed line and in an exaggerated way, for sake of clarity, the deformation of the base beam 20 while biasing the corresponding piezoelectric strip 29. As mentioned, deformation of the base beam 20 substantially consists in a contraction or shrinking thereof, with displacement and rotation in the plane XY of the second end 20B of the base beam 20 (see, in particular, the top plan view of FIG. 8). In fact, the first end 20A of the base beam 20 is constrained to the substrate 28 through the first pillar 23 (and thus, to a first approximation, does not have any degree of freedom). Instead, the second end 20B is constrained in direction Z by the constrained arm 31 (and thus may not freely deflect towards the substrate 28), but may move in the plane XY, since the second pillar 24 is not constrained to the substrate 28 and due to the presence of the base hinge structure 25, which provides (to a first approximation) an (angular) degree of freedom in the plane XY.

In practice, shrinking of the base beam 20 generates a force (as represented in an exaggerated way with a dashed line in FIG. 7 and indicated by the arrow A in FIGS. 5, 7, and 8) that "pulls" the second end 20B of the base beam 20 towards the first end 20A, causing rotation thereof in a counterclockwise direction (as represented in FIGS. 5 and 8 with a dashed line and indicated by the arrow B) due to the base constraint structure 21. Rotation of the second end 20B causes a corresponding rotation of the base lever arm 33, which also rotates in the plane XY, amplifying the movement (arrow B' of FIG. 8).

Figure 9:
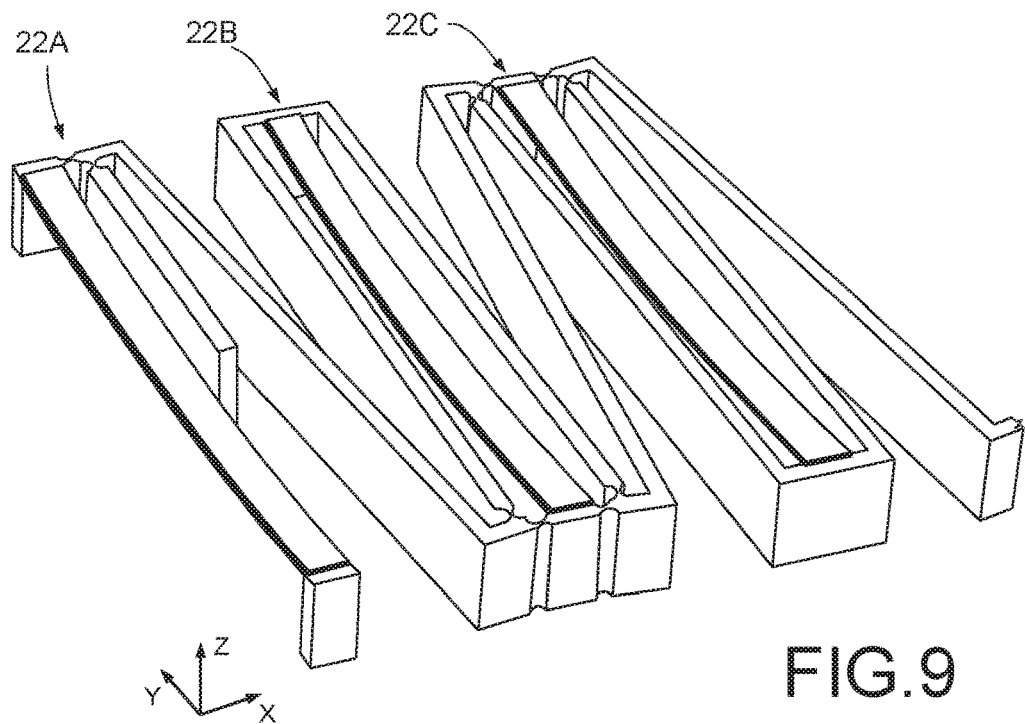
FIG. 9 is a simplified perspective view of the actuator of FIGS. 3 and 4, in the deformed condition.
Figure 10:
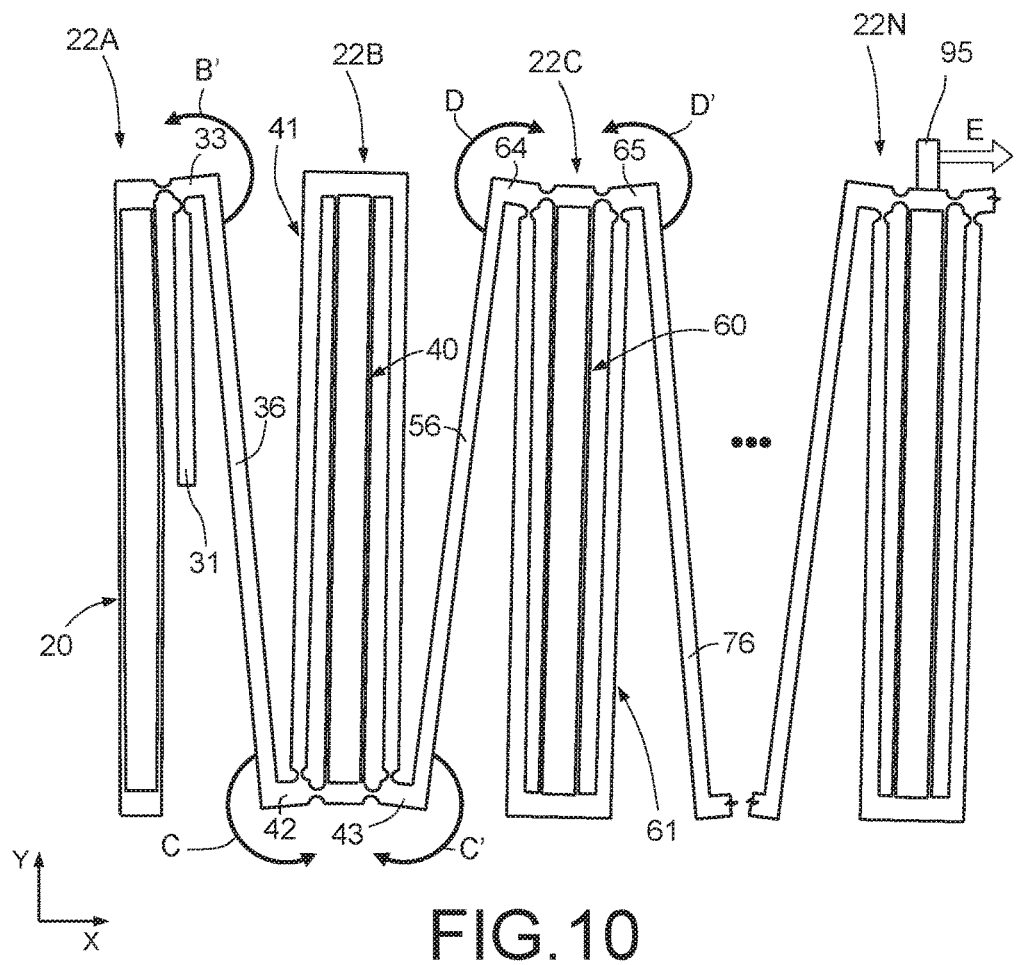
FIG. 10 is a top plan view of the actuator of FIGS. 3 and 4, in the deformed condition.

Rotation of the base lever arm 33 is transferred to the first lateral unit 22B through the first connection arm 36, fixed with respect to the base lever arm 33 and to the first lateral lever arm 42, as illustrated in FIGS. 9, 10.

Simultaneous biasing of the first and second lateral units 22B, 22C causes similar deformations and displacements thereof and, as a whole, movement of the lateral unit 22A, 22C away from the base unit 22A, in "concertina" fashion. In fact, as may be seen in particular in FIG. 10, shrinking of the piezoelectric material strips 49, 69 causes shortening in direction Y and deformation of the corresponding lateral beams 40, 60, with a mechanism similar to the one described for the base beam 20. However, contrary to the base unit 20A, in the lateral units 22B, 22C, because of the symmetry of the constraint structures 41, 61, the second ends 40B and 60B of the lateral beams 40, 60 may not displace in direction X; translation in direction Y of the second ends 40B and 60B, however, causes a "pull" action on the lateral lever arms 42, 43 and 62, 63 and thus rotation thereof in the plane XY, as represented in FIG. 10 by arrows C, C', D and D'.

In particular, rotation of the first lateral lever arm 42 (arrow C) is concordant with the rotation, indicated by arrow B, of the lever arm 33 of the base unit 22A (transmitted through the first connection arm 36) and, to a first approximation, of the same amount. This causes the first lateral beam 40 to rotate (with respect to the first lateral lever arm 42) through an angle equal and opposite to that of the rotation transmitted by the first connection arm 36. Consequently, to a first approximation, the two rotations cancel out, and the first lateral beam 40 does not rotate with respect to the Cartesian reference system XYZ, but shifts laterally in direction X, away from the base unit 22A.

Likewise, rotation of the second lever arm 43 of the first lateral unit 22B (arrow C') causes rotation in a clockwise direction of the second connection arm 56 and of the first lever arm 63 of the second lateral unit 22C. Analogously to the above, the second lateral beam 60 rotates in a direction opposite to the first lever arm 63 of the second lateral unit 22C; thus, the two rotations cancel out, and the second lateral beam 60 undergoes only, to a first approximation, a displacement in direction X, without rotating. The displacement in direction X generated by the first lateral unit 22A is thus amplified by the second lateral unit 22B.

Each possible lateral unit (not illustrated) may amplify the movement in direction X. The last unit of the series, designated by 22N in FIG. 10, may comprise an actuation element 95 directly connected to one of the ends of the n-th lateral beam 80 so that its displacement is, to a first approximation, oriented only in direction X (as indicated by arrow E). Other solutions are, however, possible.

In this way, due to the presence of the Z-constraint structure 21 (constrained arm 31 and base hinge structure 25), the second end 20B of the base beam 20 essentially moves in the plane XY, converting the strains generated by the piezoelectric effect, and directed according to axis Z, into a in-plane movement. The base lever arm 33 and the lateral units 22B, 22C, . . . , 22N amplify this in-plane movement to obtain a greater actuation amplitude, substantially in a direction perpendicular to the longitudinal extensions of the units 22.

An actuated member of an electronic device (not illustrated) may thus be connected to the actuation element 95. For instance, the actuation member 95 may be connected to a liquid-jet printing head, an autofocus system, a micropump, a microswitch, an optical-fiber aligner, an atomic-force microscope for measurements of surface roughness, a hard-disk device, a precision surgical instrument, a precision positioning device, etc.

Figure 11:
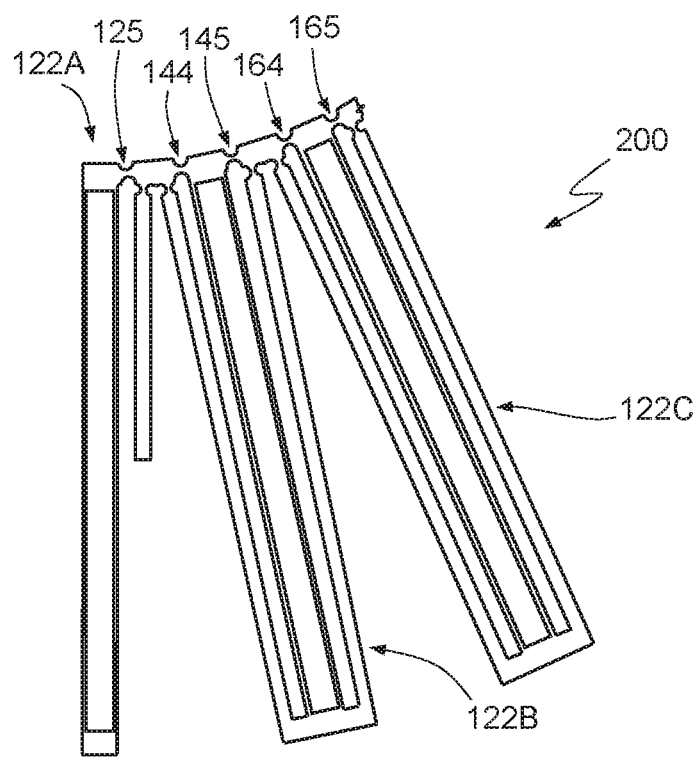
FIG. 11 shows in top plan view a different embodiment of the present actuator, in the deformed condition.

It is, however, possible to modify the structure of the actuator 100 so as to obtain a rotation movement of the structure ("fan-like" movement) and thus a circumferential actuation force. For instance, FIG. 11 shows an embodiment of a rotary actuator 200, comprising a plurality of units 122A, 122B, 122C, . . . , oriented in the same way, i.e., with the hinge structures 125, 144, 145, 164, 165 aligned to each other (in a rest condition of the actuator 200). In this case, as illustrated in FIG. 11, when actuated, all the units 122A, 122B, . . . , 122N rotate in a same direction (here counterclockwise), so that it is possible to obtain an amplified rotation movement.

Figure 12:
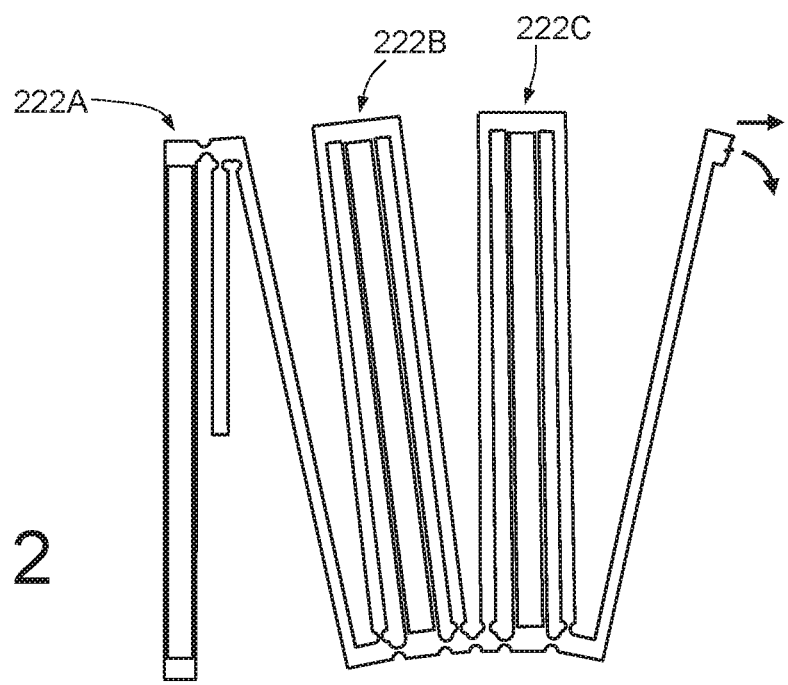
FIG. 12 shows in top plan view yet another embodiment of the present actuator, in the deformed condition.

According to another embodiment (see FIG. 12), the lateral units 222B, 222C may be arranged at 180° with respect to the base unit 222A, so as to obtain a roto-translation (a movement similar to that of the hinges of cabinet doors that are able to rotate and extend).

Finally, it is clear that modifications and variations may be made to the actuator described and illustrated herein, without thereby departing from the scope of the present disclosure.

For instance, the base unit 22A could be formed like the lateral units 22B, 22C, or exactly like one half thereof, with the difference that the first end 20A of the base beam 20 is in any case anchored to the substrate 28 through the first pillar 23 for supporting the monolithic region 121. In particular, the constrained arm 31 might not be anchored to the substrate 28 and extend throughout the length of the base beam 20, parallel thereto, with a first end articulated to the second end 20B of the base beam 20 (as illustrated in the figures) and a second end connected to the first end 20A of the base beam 20, as in the lateral units 22A, 22B for the lateral constrained arms 52, 53.

Alternatively, the constrained arm 31 could be anchored to the substrate 28, and extend throughout the length of the base beam 20, parallel thereto, in the way described above. According to another embodiment, the constrained arm 31 could be formed by a simple column anchored to the substrate 2.

The piezoelectric strips may be of a different material, for example of AlN or KNN (sodium potassium niobate—(K, Na)NbO$_3$).

The base unit 22A may also be anchored laterally, forming the first end 20A of the base beam 20 protruding from a frame fixed with respect to the substrate 28 and surrounding the monolithic region 121.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A MEMS actuator device comprising:
   a substrate; and
   a base unit, the base unit including:
      a base beam element having a first end, a second end, a main extension in an extension plane and a thickness in a thickness direction that is perpendicular to the extension plane and smaller than the main extension;
      a piezoelectric region on or in the base beam element;

an anchor region fixed with respect to the base beam element and to the substrate; and a base constraint structure coupled to the second end of the base beam element, the base constraint structure including a base constraint element that is undeformable in the thickness direction and a base hinge structure arranged between the base beam element and the base constraint element, the base constraint structure being configured to allow a movement of the second end of the base beam element in the extension plane and prevent or substantially reduce a deformation of the base beam element in the thickness direction.

2. The device according to claim 1, wherein the base constraint element has a thickness greater than the base beam element.

3. The device according to claim 1, wherein the anchor region extends between the first end of the base beam element and the substrate, and the base constraint element includes a wall extending parallel to the base beam element and anchored to the substrate.

4. The device according to claim 1, wherein the base hinge structure includes a hinge region coupled to the second end of the base beam element and to the base constraint element, the hinge region having a smaller width than the base beam element and the constraint element and a thickness in the thickness direction greater than the base beam element.

5. The device according to claim 1, wherein the base unit is coupled to a first lateral unit through the base hinge structure, the first lateral unit being formed by a first lateral beam element and a first lateral constraint structure, the first lateral beam element having a main extension in the extension plane, a thickness in the thickness direction that is smaller than its main extension, a respective first end and a respective second end, and supporting a respective piezoelectric region, the first lateral constraint structure being rigid with the first end of the first lateral beam element and articulated to the second end of the first lateral beam element, the first lateral constraint structure being configured to allow a deformation of the first lateral beam element in the extension plane and prevent or substantially reduce a deformation of the first lateral beam element in the thickness direction.

6. The device according to claim 5, wherein the base unit is coupled to the first lateral unit through a base lever arm that is coupled to the base hinge structure and to the first lateral constraint structure.

7. The device according to claim 6, wherein the first lateral beam element extends, at rest, parallel to the base beam element, and the base lever arm extends, at rest, perpendicular to the base beam element.

8. The device according to claim 7, wherein the base hinge structure includes a first base hinge element arranged between the second end of the base beam element and an end of the base lever arm and a second base hinge element arranged between the end of the base lever arm and the base constraint structure, the first and second base hinge elements having respective thicknesses in the thickness direction greater than the base beam element and a width in the extension plane smaller than the base beam element and the base lever arm.

9. The device according to claim 6, wherein the first lateral unit includes a first lateral lever arm coupled to the second end of the first lateral beam element and coupled to the base lever arm.

10. The device according to claim 9, wherein the first lateral constraint structure includes a first lateral constrained arm and a first lateral hinge structure, the first lateral constrained arm extending, at rest, parallel to and at a distance from the first lateral beam element and having a first end rigidly coupled to the first end of the first lateral beam element and a second end coupled to the second end of the first lateral beam element through the first lateral hinge structure.

11. The device according to claim 10, wherein the first lateral hinge structure includes a first lateral hinge element arranged between the second end of the first lateral beam element and the first lateral lever arm and a second lateral hinge element arranged between the first lateral lever arm and the second end of the first lateral constrained arm, the first and second lateral hinge elements having respective thicknesses in the thickness direction greater than the first lateral beam element and a width in the extension plane smaller than the first lateral lever arm and the first lateral constrained arm.

12. The device according to claim 9, wherein the first lateral unit includes a second lateral lever arm coupled to the second end of the second lateral beam element on an opposite side to the first lateral lever arm, and the first lateral constraint structure further includes a second lateral constrained arm and a second lateral hinge structure, the second lateral constrained arm extending, at rest, parallel to and at a distance from the first lateral beam element and having a first end rigidly coupled to the first end of the first lateral beam element and a second end coupled to the second end of the first lateral beam element through the second lateral hinge structure.

13. The device according to claim 12, wherein the second lateral hinge structure includes a third lateral hinge element arranged between the second end of the first lateral beam element and the second lateral lever arm, and a fourth lateral hinge element arranged between the second lateral lever arm and the second end of the first lateral constrained arm, the third and fourth lateral hinge elements having respective thicknesses greater than the first lateral beam element and a width in the extension plane smaller than the second lateral lever arm and the second lateral constrained arm.

14. The device according to claim 12, wherein the first lateral unit is coupled to a second lateral unit through the second lateral lever arm, the second lateral unit being formed by a second lateral beam element and a second lateral constraint structure, the second lateral beam element having a main extension in the extension plane, a thickness in the thickness direction, a respective first end and a respective second end and supporting a respective piezoelectric region, the second lateral constraint structure being fixed with respect to the first end of the second lateral beam element and hinged to the second end of the second lateral beam element and to the first lateral unit, the second lateral constraint structure being configured to allow a deformation of the second lateral beam element in the extension plane and prevent or substantially reduce a deformation of the second lateral beam element in the thickness direction.

15. The device according to claim 9, further comprising a first connection arm rigidly coupled to the base lever arm and to the first lateral lever arm, the first lateral lever arm extending, at rest, parallel to and at a distance from the base lever arm, and the first connection arm extending, at rest, transverse to the base lever arm and to the first lateral lever arm between the base unit and the first lateral unit.

16. The device according to claim 14, wherein the second lateral unit includes a third lateral lever arm hinged to the second end of the second lateral beam element, the device further comprising a second connection arm extending, at rest, parallel to the first and second lateral beam elements, the second connection arm being fixed with respect to the second lateral lever arm and to the third lateral lever arm and extending between the first and second lateral beam elements.

17. The device according to claim 14, wherein, at rest, the first end of the first lateral beam element and the first end of the second lateral beam element are aligned with respect to each other, and the second end of the first lateral beam element and the second end of the second lateral beam element are aligned with respect to each other.

18. The device according to claim 17, wherein the base lever arm and the first lateral lever arm extend along each other and are rigid to each other, and the second lateral lever arm is hinged to the second lateral constraint structure of the second lateral unit.

19. The device according to claim 14, wherein the base unit and the first and second lateral units are formed in a same monolithic layer of semiconductor material.

20. A MEMS actuator device comprising:
a substrate;
a base beam element having a first end coupled to the substrate, the base beam element include a second end suspended relative to the substrate and configured to move relative to the substrate, the base beam element having a suspended element between the first and second ends, the suspended element having a first thickness, the suspended element and the second end being configured to move in a plane parallel to a surface of the suspended element and reduce deformation in a direction parallel to a surface of the first thickness;
a base constraint element having a longitudinal length, the base constraint element coupled to the substrate along its longitudinal length;
a base hinge structure coupling the second end of the base beam element to the base constraint element; and
a piezoelectric region on or in the suspended element.

21. The MEMS actuator device according to claim 20, comprising a lateral beam coupled to the base beam in series, the lateral beam having first and second ends that are suspended relative to the substrate and configured to move relative to the substrate, the lateral beam including a suspended element between the first and second ends and a piezoelectric region on or in the suspended element.

22. The MEMS actuator device according to claim 21, comprising at least one constrained arm between the lateral beam and the base beam that couples the lateral beam to the base beam in series.

23. The MEMS actuator device according to claim 22, comprising first and second hinges, the first hinge between the base beam and the at least one constrained arm, the second hinge between the lateral beam and the at least one constrained arm.

* * * * *